United States Patent
Katzman et al.

(10) Patent No.: US 7,342,520 B1
(45) Date of Patent: Mar. 11, 2008

(54) METHOD AND SYSTEM FOR MULTILEVEL SERIALIZER/DESERIALIZER

(76) Inventors: Vladimir Katzman, 28119 Ridgefern Ct., Rancho Palos Verdes, CA (US) 90275; Vladimir Bratov, 28119 Ridgefern Ct., Rancho Palos Verdes, CA (US) 90275

( * ) Notice: Subject to any disclaimer, the term of this patent is extended or adjusted under 35 U.S.C. 154(b) by 847 days.

(21) Appl. No.: 10/754,463

(22) Filed: Jan. 8, 2004

(51) Int. Cl.
*H03M 9/00* (2006.01)
(52) U.S. Cl. ...................... 341/100; 341/101
(58) Field of Classification Search ........... 341/100, 341/101, 69; 710/66, 52; 370/539, 535
See application file for complete search history.

(56) References Cited

U.S. PATENT DOCUMENTS

| | | | |
|---|---|---|---|
| 4,525,804 A * | 6/1985 | Mosier et al. | 710/66 |
| 6,154,797 A * | 11/2000 | Burns et al. | 710/52 |
| 6,624,766 B1 * | 9/2003 | Possley et al. | 341/69 |
| 2003/0103509 A1 * | 6/2003 | Kendall et al. | 370/395.1 |
| 2003/0103533 A1 * | 6/2003 | Hilgers et al. | 370/539 |
| 2004/0047371 A1 * | 3/2004 | Lentine et al. | 370/535 |

* cited by examiner

*Primary Examiner*—Jean B Jeanglaude
(74) *Attorney, Agent, or Firm*—Christie, Parker & Hale, LLP.

(57) ABSTRACT

A serial bit transparent data transferring technique eliminating the bit ambiguity problem of the standard time-division multiplexing/demultiplexing architecture without introduction of any extra latency. A serializer multiplexer converts input parallel data words into a serial data bit stream under control of a serializer timing circuit. An output multilevel buffer retimes the serialized data and increases the amplitude of certain bits with a preselected value to mark positions of out-going serial data words. The bits are defined by a serializer digital data converter also controlled by the same timing circuit. The imposed marking pulses are retrieved from the input serial data stream by a multilevel input detector of a deserializer timing circuit and used for the synchronization of the demultiplexing operation. As a result, the deserializer directly reconstructs the original bit order from the serial data bit stream with no extra bits, thus providing minimal possible latency and full data rate.

8 Claims, 7 Drawing Sheets

METHOD AND SYSTEM FOR MULTILEVEL SERIALIZER/DESERIALIZER

BACKGROUND OF THE INVENTION

The present invention relates generally to the field of digital data communications and more specifically to low-latency serializers/deserializers.

Data exchange between different points of communication (e.g.: computers, processors, memory units, etc.) through a serial link may use a multiplexing operation performed by a multiplexer (MUX) at a transmitter side followed by an inverse demultiplexing operation performed be a demultiplexer (DMUX) at a receiver side.

The MUX converts N-bit wide parallel data words $d_i = \{d_{(i)1}, d_{(i)2}, \ldots d_{(i)N}\}$ with bit rate B into a serial bit stream $ds = (\ldots ds_{(i-1)N}, ds_{(i)1}, ds_{(i)2}, \ldots ds_{(i)N}, ds_{(i+1)1}, \ldots)$ with rate NB under control of timing signals $sel_1, sel_2, \ldots sel_K$ generated by a transmitter circuitry. For a binary MUX with a tree architecture, the relation between the parallel word width and the number of timing signals is given by equation $N=2^K$, the signal $sel_1$ is equal to the line-rate clock, and the signal $sel_{(j+1)}$ is derived from the signal $sel_j$ by "frequency divide-by-2" operation. For a MUX with shift-register architecture, two timing signals are used: a line-rate (or divided-by-2) clock and a bit-wide signal WE with divided-by-K frequency, where again $N=2^K$. In any case, the phase relation between the parallel and serial data words is arbitrary depending on the timing signal initial settings.

The DMUX converts the serial data stream back into N-bit parallel words under control of the same set of timing signals but generated by a receiver circuitry, and thus having no phase correlation with the transmitter timing signals. This is the reason for the well-known ambiguity of demultiplexing operation, which can be illustrated by an example of a 4-bit transmission system with a tree architecture.

In the case of this simplified system, the MUX output signal is defined by a logic function $ds = d_1 \cdot sel_2^{TR} \cdot sel_1^{TR} + d_2 \cdot \overline{sel_2^{TR}} \cdot sel_1^{TR} + d_3 \cdot sel_2^{TR} \cdot \overline{sel_1^{TR}} + d_4 \cdot \overline{sel_2^{TR}} \cdot \overline{sel_1^{TR}}$, where the top index TR indicates the transmitter. This signal when processed by the DMUX will deliver the first parallel bit value defined by a logic function $dp = ds \cdot sel_2^{RC} sel_1^{RC}$, where the index RC corresponds to the receiver. One skilled in the art can see that $dp = d_1$ if and only if both $sel_1^{RC} = sel_1^{TR}$ and $sel_2^{RC} = sel_2^{TR}$, which is impossible without a strict transmitter/receiver synchronization. In the case of shift-register architecture, the corresponding condition is $WE^{RC} = WE^{TR}$. The lack of synchronization results in the equal probability 1/N of getting any bit of the word at the first output of the DMUX.

In existing data communication systems these conditions are satisfied by a framing operation, which inserts some redundant bits for marking a word position in the outcoming bit stream. The presence of extra bits increases the system latency and results in higher transmission frequency requirements. Various transmission protocols, such as Infiniband, 3GIO, Gigabit Ethernet, SONET/SDH, etc. have been devised to establish the synchronization, but all of them require additional expensive circuitry and/or software for operation.

SUMMARY OF THE INVENTION

A serial data bit transferring technique is provided. The technique eliminates the bit ambiguity problem of a standard time-division multiplexing/demultiplexing architecture without introduction of additional latency by alignment of an incoming serial data word at the DESerializer (DES) side based on marking pulses of increased amplitude imposed onto the data bit stream by the SERializer (SER) to mark positions of the out-going serial data words. The serializer includes two MUltipleXer (MUX) blocks with ratios N:L and L:1 converting N-bit wide parallel input data words with rate B into a serial data bit stream with rate NB and controlled by timing signals from an internal serializer timing circuit (SER_TC) with two user-selectable High-Frequency (HF) or Low-Frequency (LF) modes of synchronization.

An output Multilevel Buffer (MB) retimes the serialized data and increases the amplitude of certain bits with a preselected value at the positions specified by a SERializer Digital Data Converter (SER_DDC). The SER_DDC also encodes the L-bit wide data words after the first MUX block to provide a near-equal probability of logic "1" and logic "0" values in the output data stream thus effectively eliminating its low-frequency spectral components and ensuring regular appearance of the marking pulses with increased amplitude in direct and/or inverted output signals transmitted into single-ended or differential fiber-optic, copper or any other interconnect media. The imposed marking pulses are retrieved from the input serial data stream with bit rate NB received by an Input Detector (ID) of a DESerializer Timing Circuit (DES_TC) and used to either preset dividers of the circuit or provide a reference to its internal clock-recovery circuit, depending on the user-selected synchronization mode. The incoming serial data stream is retimed by the reconstructed HF clock and deserialized into N-bit wide parallel words with predetermined bit order by two DeMUltipleXer (DMUX) blocks with ratios 1:L and L:N controlled by signals from the deserializer timing circuit aligned to the marking pulses. The encoded L-bit wide parallel words after the first DMUX are decoded to its original bit values by a DESerializer Digital Data Converter (DES_DDC) also controlled by aligned signals from the timing circuit. As a result, the deserializer can directly reconstruct the original bit order and values from the serial data bit stream with no extra bits and maximum rate NB, thus providing minimal possible latency.

In another aspect of the invention, the present invention provides a framing technique for achieving synchronization in a SER/DES system without insertion of redundant bits into the serial data bit stream. The technique determines alignment of an incoming serial data word at the deserializer side based on marking pulses of increased amplitude imposed onto the data bit stream by the serializer to mark positions of the out-going serial data words.

In another aspect of the invention, the present invention provides a SER device for conversion of N-bit wide parallel input data words, $d_i$, with rate B into output serial data bit stream, dso, with rate NB, which includes marking pulses with increased amplitude imposed on predetermined bits with a preselected value equal to either logic "0" or logic "1". The SER device includes a first MUX block with ratio N:L for conversion of N-bit wide parallel input data words $d_i$ with rate B into L-bit wide parallel data words with rate NB/L; a SER digital data converter for encoding the data words after the first MUX block to provide a near-equal probability of logic "1" and logic "0" values in the output data bit stream and for generating synchronization pulses ssL to indicate positions of the marking signals; a second MUX block with ratio L:1 for conversion of the encoded data words with rate NB/L into a serial data bit stream ds with rate NB; a multilevel buffer for retiming the serial data ds and imposing the marking pulses at the positions indicated by the synchronization pulses ssL onto data bits with a preselected value; and a SER timing circuit for providing control signals aligned to external high-frequency clock clk or external low-frequency reference clock rfc depending on the value of an external mode-select signal msel.

In another aspect of the invention, the present invention provides a DES device for conversion of an input serial data bit stream dsi with imposed marking pulses and rate NB representing the SER output data dso passed through an interconnect media, into N-bit wide parallel data words with a predetermined first bit position correlated to that of the SER input parallel data words $d_i$. The DES device includes: a DES timing circuit for clock and data recovery based on either incoming data dsi or external HF clock clk depending on the value of an external mode-select signal msel, and also for retrieving low-frequency synchronization pulses corresponding to the marking pulses and generating timing signals aligned to those synchronization pulses; a first DMUX block with ratio 1:L for conversion of the incoming serial data with bit rate NB into L-bit wide parallel data words with rate NB/L; a DES digital data converter for decoding the data words after the first DMUX into the original bit values; and a second DMUX block with ratio L:N for conversion of the decoded data words into N-bit wide parallel data words with a predetermined bit order.

BRIEF DESCRIPTION OF THE DRAWINGS

These and other features, aspects, and advantages of the present invention will become better understood with regard to the following description, appended claims, and accompanying drawings where:

DETAILED DESCRIPTION

Figure 1:
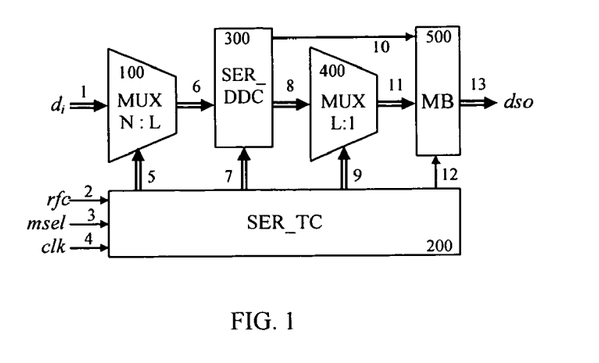
FIG. 1 is a block diagram of a serializer in accordance with an exemplary embodiment of the present invention.
Figure 5:
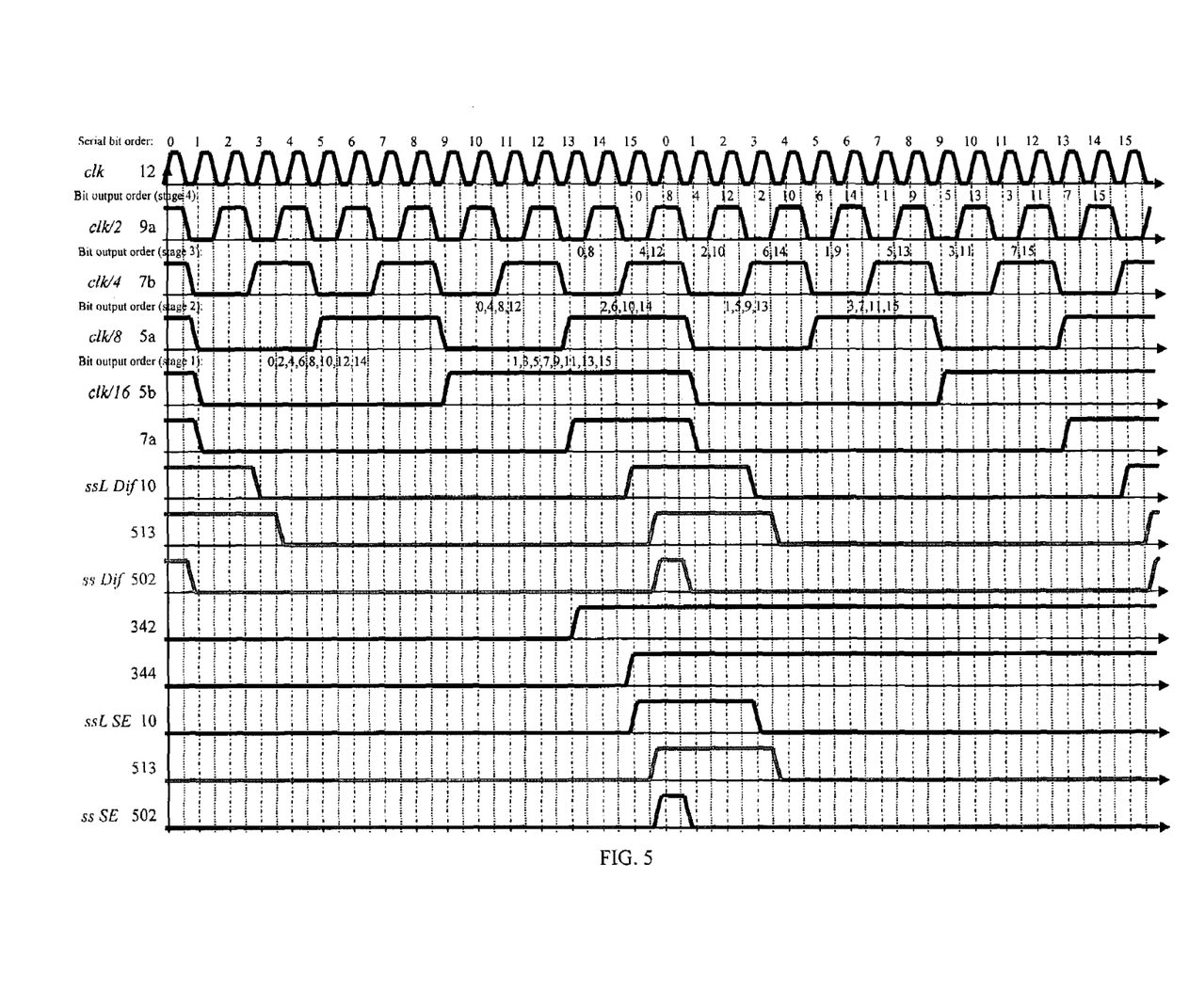
FIG. 5 is a timing diagram for a serializer in accordance with an exemplary embodiment of the present invention.

FIG. 1 is a block diagram and FIG. 5 is a timing diagram for a serializer in accordance with an exemplary embodiment of the present invention. Referring now to FIG. 1, input parallel low speed data words $d_i$ 1 are applied to the input of MUX N:L 100. MUX N:L converts the N-bit wide parallel words $d_i$ with rate B into L-bit wide parallel data words 6 with rate NB/L (e.g. 2B, 4B, etc.) under control of timing signals 5 generated by SER_TC block 200. Data words 6 are encoded by SER_DDC block 300 in order to achieve a near-equal probability of logic "1" and logic "0" values in the output data stream dso 13. SER_DDC 300 also generates L-bit long synchronization pulses ssL 10 to indicate desired positions of marking pulses in the out-going serial data 13.

All operations performed by SER_DDC 300 are controlled by timing signals 7 generated by SER_TC 200. The encoded data words 8 from SER_DDC 300 are further multiplexed into a serial data stream 11 by MUX L:1 400 under control of timing signals 9 generated by SER_TC 200. Multilevel Buffer (MB) 500 uses a timing signal 12 for retiming data stream 11 and for conversion of signal ssL 10 into a 1-bit long synchronization pulse ss. MB 500 also increases the amplitude of bits coincident to the pulse ss in the out-going serial data stream 13 if the original value of these bits is equal to a preselected value. In the case of a signal having two possible logic levels (e.g. with one logic level indicating a "1" and a another logic level indicating a "0") MB 500 imposes an additional signal level or marking pulse on a bit having a selected logic level. For example, high bits (e.g. logic "1" bits) receive a marking pulse, while the amplitudes of bits with the opposite value (e.g. logic "0") are not effected.

SER_TC 200 receives an external High Frequency (HF) clock clk 4 and/or an external Low Frequency (LF) reference clock rfc 2. Depending on the mode of synchronization defined by an external signal msel 3. In response, SER_TC 200 generates timing signals 5, 7, 9, and 12 using frequency division and logic operations either with or without prior clock multiplication.

Figure 2:
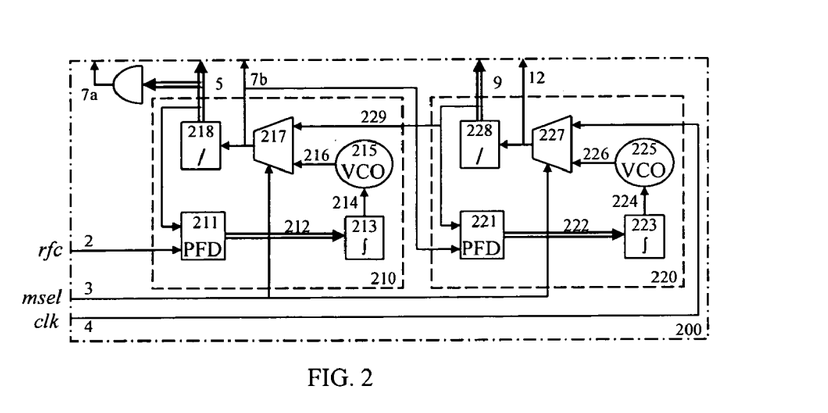
FIG. 2 is a timing circuit block diagram for a serializer in accordance with an exemplary embodiment of the present invention.

FIG. 2 is a block diagram of a timing circuit for the serializer, or SER_TC block 200 (of FIG. 1). FIG. 5 is a timing diagram for the serializer in accordance with an exemplary embodiment of the present invention. Referring now to FIG. 2, the SER_TC block includes a HF Phase-Locked Loop (PLL) 220 and a LF PLL 210 with similar structures, both including a Phase/Frequency Detector (PFD), 211 and 221, generating control signals, 212 and 222 converted by integrators 213 and 223 into control voltages 214 and 224 for Voltage-Controlled Oscillators (VCOs), 215 and 225 respectively. The clock signals generated by the VCOs, 216 and 226, are supplied to the first inputs of two-input selectors, 217 and 227, controlled by external signal msel 3. The outputs of the selectors are connected to clock frequency dividers, 218 and 228.

The timing circuit can operate in two modes. In a first mode, a frequency selection signal, msel 3, connects the outputs of selectors 217 and 227 to the corresponding VCO outputs 216 and 226. PLL 210 aligns its slowest clock signal with frequency B connected to the first input of PFD 211 to external reference clock rfc 2 connected to the second input of the same PFD. The generated clock signal 7b with frequency BN/L is then used by PLL 220 as a reference for alignment of its LF clock signal 229 and generating the most HF clock signal 12 with frequency BN. Generated clock signals 12 and 7b, as well as divided clock signals 9 and 5 are used as timing signals. One more timing signal 7a is created by an AND function applied to signals 5 and presents an L-bit long pulse with frequency B as shown in the timing diagram of FIG. 5.

In the second mode of operation, selectors 217 and 218 disconnect the VCO outputs thus disabling the internal loops. External HF clock clk 4 is then used as the clock signal 12 and the divided signal 229 represents the clock signal 7b.

The type of a serial link between the serializer and the deserializer affects the structure of the system internal blocks. In the case of a single-ended connection, the probability of the required logic value (logic "1" in the drawing) at the desired bit positions intended for imposing marking signals depends on the data structure to be transmitted. To ensure high enough regularity of the marking signal appearance in the serial data stream, a data encoding algorithm is used to provide a near-equal probability of logic "1" and logic "0" values in the output serial data stream. In one embodiment of the present invention, the algorithm is implemented by SER_DDC 300.

Figure 3:
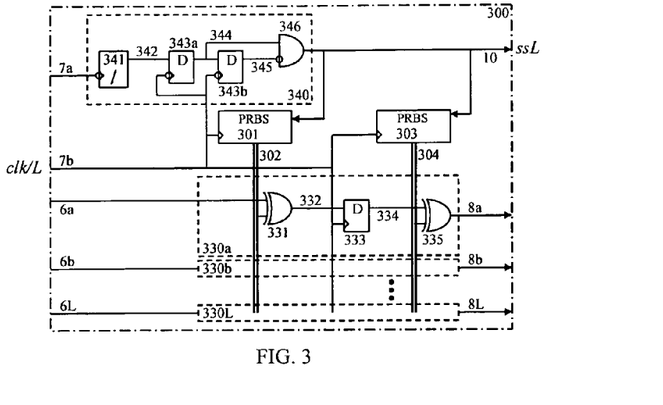
FIG. 3 is a block diagram for a serializer single ended digital data converter in accordance with an exemplary embodiment of the present invention.

FIG. 3 is a block diagram for a serializer single ended digital data converter, or SER_DDC 300 (of FIG. 2), in accordance with an exemplary embodiment of the present invention. L-bit wide parallel data words 6a to 6L are processed by the first scrambler including first Pseudo-Random Binary Sequence (PRBS) generator 301 with a certain characteristic polynomial and L delayed outputs 302 connected to L XOR logic gates 331. The output signals 332 of the gates 331 are retimed by clk/L signal 7b in D-type flip-flops 333. The retimed data bits 334 are further processed by the second scrambler including second PRBS generator 303 with a different characteristic polynomial and L delayed outputs 304 connected to L XOR logic gates 335.

The PRBS generators are preset by synchronization signal ssL 10 after every K encoding cycles, where the value of K is defined in accordance with the characteristic polynomials. Signal ssL with frequency B/K is generated by synchronization sub-block 340 from the timing signal 7a using divider-by-K 341 with its output 342 connected to a chain of two D-type flip-flops 343, and a logic AND gate 346 with its first non-inverting input connected to the output 344 of the first flip-flop and its second inverting input connected to the output 345 of the second flop-flop. The shapes of signals 342, 344, and 10 are shown in the timing diagram of FIG. 5.

In case of a differential connection, the presence of the required logic value is guaranteed in either direct or inverted output data stream, thus ensuring absolute regularity of marking bits for any type of transmitted data. The data scrambling becomes optional and the timing signal 7a needs no frequency division resulting in the same frequency B of signal ssL 10.

Figure 4:
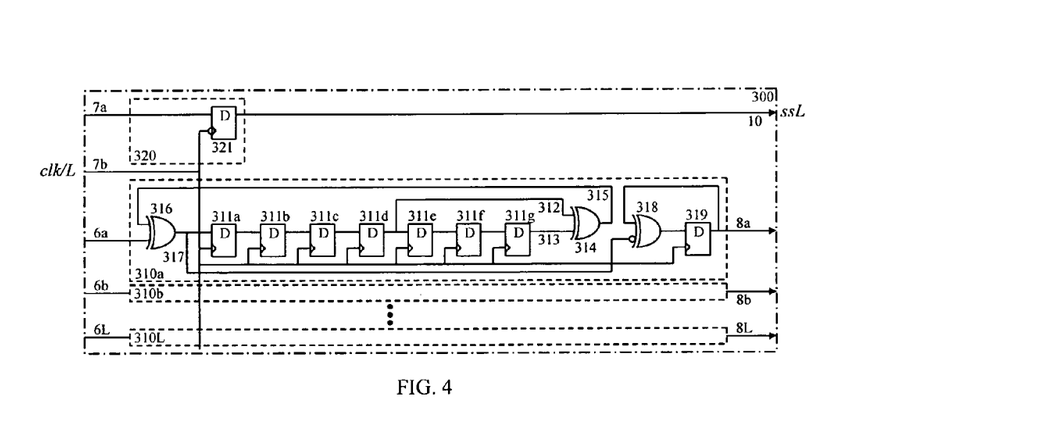
FIG. 4 is a block diagram serializer differential digital data converter in accordance with an exemplary embodiment of the present invention.

FIG. 4 is a block diagram for a serializer differential digital data converter in accordance with an exemplary embodiment of the present invention. The differential digital data converter block includes synchronization sub-block 320 represented by one retiming flip-flop 321 converting timing signal 7a into synchronization signal 10 shown in FIG. 1, and L optional self-synchronizing scramblers 310. Each scrambler includes a PRBS generator with a shift register incorporating D-type flip-flops 311a to 311g, a feed-back XOR gate 314, and a summing XOR gate 316. An encoder including an XOR gate 318 combines the randomized bits 317 with the output of the XOR gate 318 delayed for 1 period by a flip-flop 319.

Multilevel buffer 500 of the present invention is responsible for imposing marking bits onto the output serial data bit stream. The buffer operates with either single-ended or differential data signals depending on the system link type.

Figure 6A:
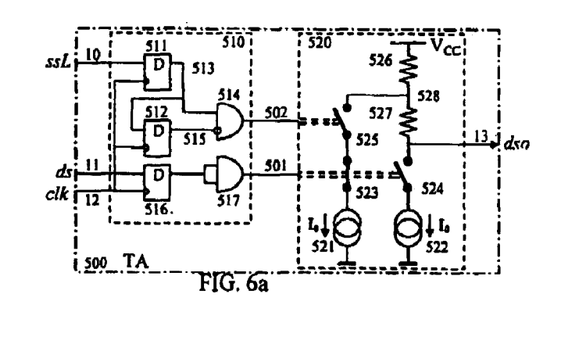
FIG. 6a is a block diagram for a single ended multilevel buffer in accordance with an exemplary embodiment of the present invention.
Figure 6B:
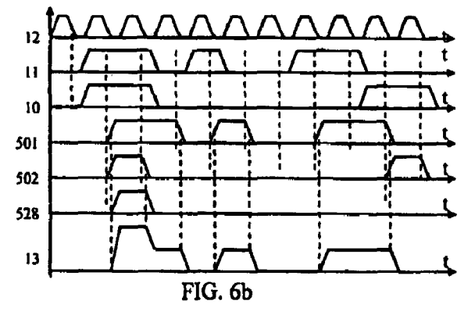
FIG. 6b is a timing diagram for a single ended multilevel buffer in accordance with an exemplary embodiment of the present invention.

FIG. 6a is a block diagram and FIG. 6b is a timing diagram for a single ended multilevel buffer in accordance with an exemplary embodiment of the present invention. The multilevel circuit block includes retiming sub-block 510 and single-ended current-switching stage 520. Sub-block 510 converts L-bit long synchronization pulses ssL 10 into 1-bit long retimed synchronization pulses 502 using a chain of 2 flip-flops 511 and 512 with its first output 513 connected to the first non-inverting input of AND gate 514 and its second output 515 connected to the second inverting input of the gate 514. The shapes of signals 513 and 501 are shown in the timing diagram of FIG. 6b. The sub-block also retimes serialized data 11 using flip-flop 516 and dummy buffer 517 for alignment of retimed data 502 with synchronization pulses 501. Current-switching stage 520 generates a multilevel output signal based on data 501, which controls complementary switches 523 and 524, and on synchronization pulse 502, which controls switch 525 in accordance with the following algorithm:

1. During the normal operational mode of data transferring, switch 525 is closed and the voltage drop across resistor 526 is kept constant by current 521 running through closed switches 525 and 523 while switch 524 is open, or by current 522 running through resistor 527 and closed switch 524 while switch 523 is open. In the first case, the level of the output signal 13 is equal to normal logic "1" defined as $V_{13}^1 = V_{CC} - I_0 R_{526}$. In the second case, it equals to logic "0" defined as $V_{13}^0 = V_{CC} - I_0(R_{526} + R_{527})$. The corresponding pulse shapes are shown in the timing diagram of FIG. 6b.
2. During the marking pulse insertion period, switch 502 is open and the current flow through series resistors 526 and 527 is controlled by switch 524 generating output voltage levels of the logic "0" or increased logic "1+" equal to $V_{CC}$ as shown in FIG. 6b. As a result, the data bits with logic "1" value are converted into marking pulses with the value "1+" while the bits with logic "0" value are not changed and do not carry any synchronization information.

Figure 7A:
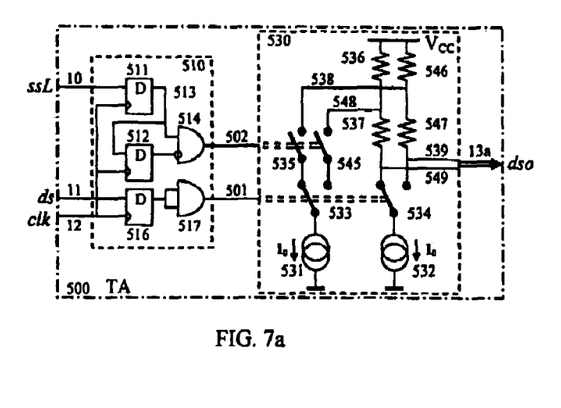
FIG. 7a is a block diagram for a differential multilevel buffer in accordance with an exemplary embodiment of the present invention.
Figure 7B:
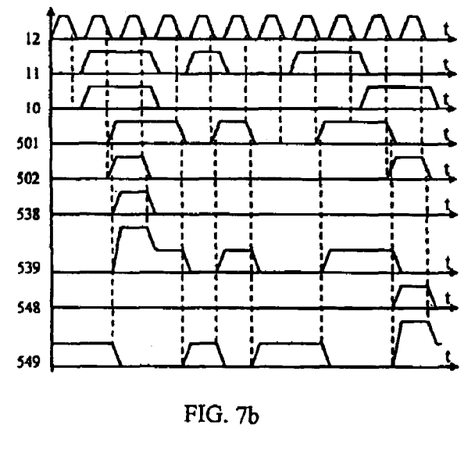
FIG. 7b is a timing diagram for a differential multilevel buffer in accordance with an exemplary embodiment of the present invention.

FIG. 7a is a block diagram and FIG. 7b is a timing diagram for a differential multilevel buffer in accordance with an exemplary embodiment of the present invention. The block includes the same retiming sub-block 510 and differential current-switching stage 530, which is actually a combination of two single-ended stages driven by common current sources 531 and 532, each implementing the algorithm described above. One skilled in the art can see that the increased voltage levels appear at outputs 539 or 549 following each synchronization pulse and thus carrying synchronization information in every out-going serial data word as shown in the timing diagram of FIG. 7*b*.

Figures 8, 9:
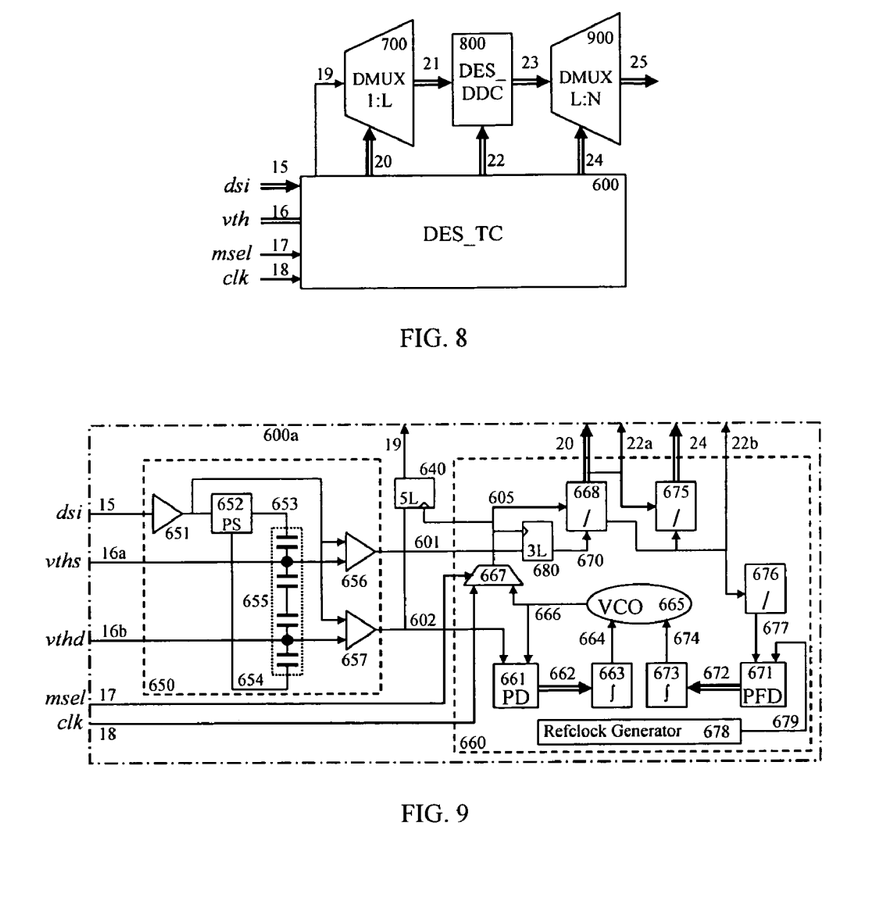
FIG. 8 is a block diagram of a deserializer in accordance with an exemplary embodiment of the present invention.
FIG. 9 is a timing circuit block diagram of a single ended deserializer in accordance with an exemplary embodiment of the present invention.

FIG. 8 is a block diagram of a deserializer in accordance with an exemplary embodiment of the present invention. Having passed through an interconnect media (not shown in the drawings), the serializer output data bit stream dso 13 (of FIG. 1) with imposed marking bits is received by the DES_TC block 600 of the deserializer as an input data bit stream dsi 15. DES_TC 600 retrieves data and LF synchronization signals corresponding to marking bits from the incoming bit stream using internal or external threshold voltages vth 16. DES_TC 600 also recovers the internal line-rate clock based ether on the incoming data or on an external HF clock clk 18, depending on the synchronization mode defined by an external select signal msel 17. Finally, DES_TC 600 delivers a retimed serial data 19 to the input of DMUX 1:L 700 and generates timing signals 20, 22, and 24 aligned to the retrieved LF synchronization signals. DMUX 700 converts the serial data 19 into L-bit wide parallel data words 21, which are decoded to their original bit values by the DES_DDC block 800. The decoded words 23 are further deserialized by DMUX L:N 900 to reconstruct N-bit wide parallel data words 25. Demultiplexing and decoding operations are controlled by timing signals aligned to the marking bits, thus ensuring a matching bit order in both the output data words 25 and in the original serializer input data 1 (of FIG. 1.)

Figure 10A:
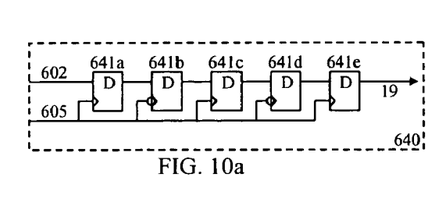
FIG. 10a is a multi-latch block diagram of a 5L block in accordance with an exemplary embodiment of the present invention.
Figure 10B:
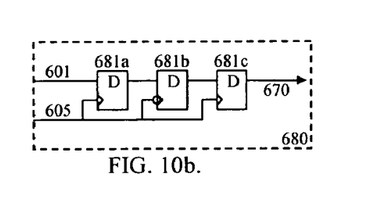
FIG. 10b is a multi-latch block diagram of a 3L block in accordance with an exemplary embodiment of the present invention.

Implementation of deserializer timing circuit DES_TC 600 in accordance with the present invention is also dependent on the type of link. FIG. 9 is a timing circuit block diagram of a single ended DES_TC 600 in accordance with an exemplary embodiment of the present invention. The circuit includes input detector 650, clock recovery circuit 660 and data alignment sub-block 640. Pick sensor 652 of the input detector 650 delivers maximum and minimum voltage levels 653 and 654 respectively, derived from input signal 15 processed by input buffer 651, to voltage divider 655, which can be implemented as a capacitive divider shown in the drawing as an example. External or generated by the divider threshold voltages 16*a* and 16*b* are used by comparators 656 and 657 for retrieval of synchronization pulses 601 and data signal 602. Circuit 660 includes a first PLL for HF clock phase alignment, which includes phase detector 661 for comparing clock 666 generated by VCO 665 to data signal 602 and delivering error signals 662 to the first integrator 663 controlling the fine-tuning port of the VCO. It also includes a second PLL for frequency window detection, which includes synchronization mode selector 667 passing either VCO clock 666 or external HF clock clk 18 to its output 605 under control of an external signal msel 17; frequency dividers 668 and 675 with preset function performed by signal 670 generated by the 3L block 680 (shown in FIG. 10*b*) from retrieved synchronization pulses 601; additional divider 676 by value K which is equal to the same value specified for the single-ended SER_DDC block 300; PFD 671 for comparing output signal 677 of the divider-by-K to internal reference clock 679 with frequency B/K generated by sub-block 678; and second integrator for processing error signals 672 from the PFD and controlling the coarse-tuning port of VCO 665.

Figure 14:
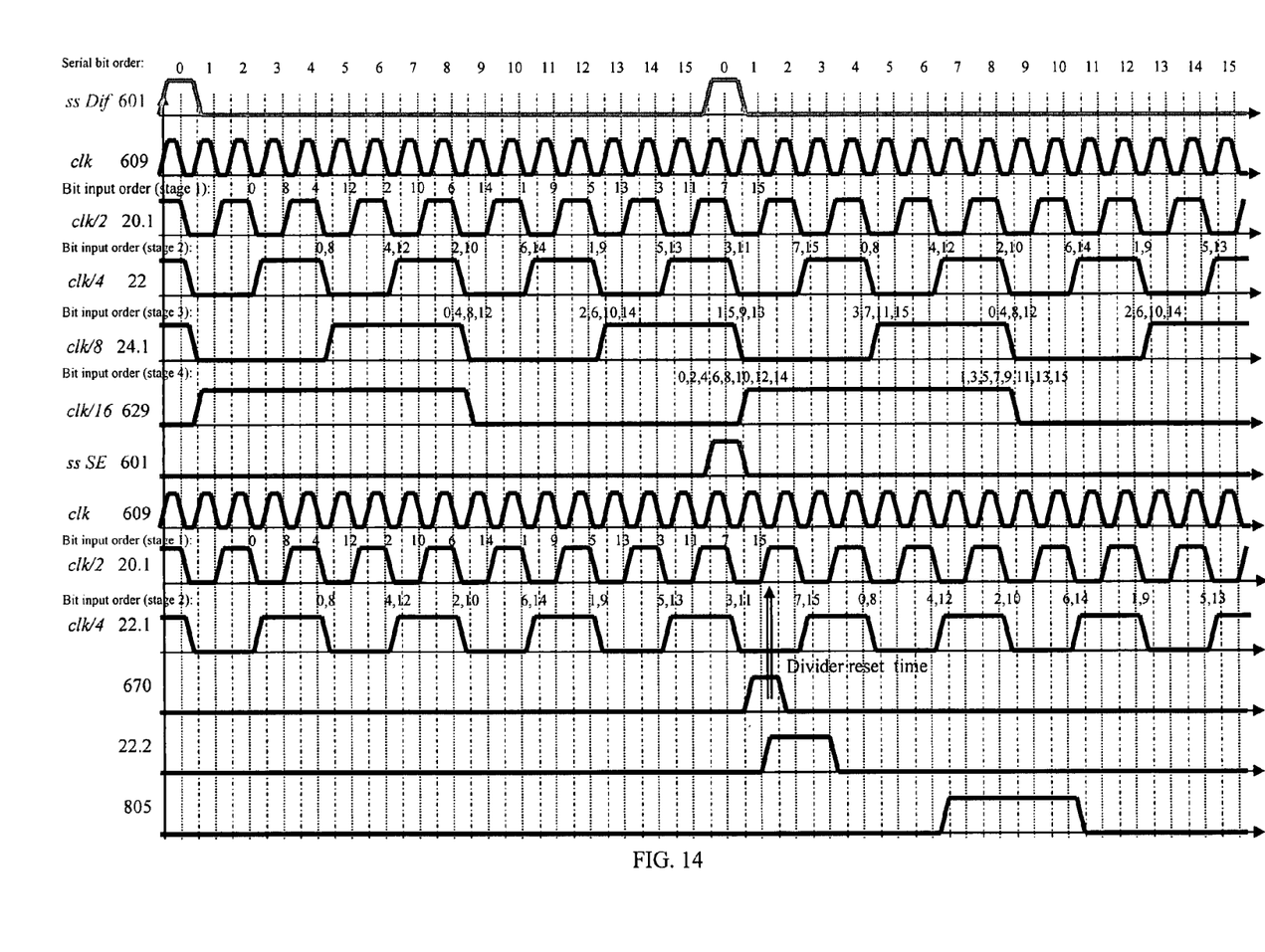
FIG. 14 is a timing diagram for a deserializer in accordance with an exemplary embodiment of the present invention.

Both loops can be enabled or disabled by setting a state of selector 667, the internal clock being derived from the incoming data stream or external clock correspondingly. In any case, timing signals 20, 22*a*, 22*b*, and 24 are preset in accordance with the marking pulses thus providing the required synchronization of the deserializer. Retrieved data signal 602 is retimed and delayed by the 5L block (shown in FIG. 10*a*) in accordance with the timing shown in FIG. 14.

Figure 11:
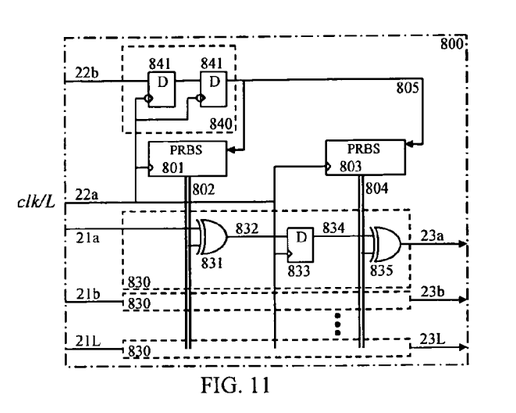
FIG. 11 is a block diagram of a single ended deserializer digital data converter in accordance with an exemplary embodiment of the present invention.

FIG. 11 is a block diagram of a single ended deserializer digital data converter in accordance with an exemplary embodiment of the present invention. Timing signals 22*a* and 22*b* are used by sub-block 840 of DES_DDC 800 to generate reset pulses 805 with frequency B/K (shown in FIG. 14) for defining initial states of PRBS generators 801 and 803, which perform data decoding together with XOR logic gates 831 and 835 and flip-flops 833. One skilled in the art can appreciate this operation as a reverse function of the single-ended SER_DDC block 300 of FIG. 3.

Figure 12:
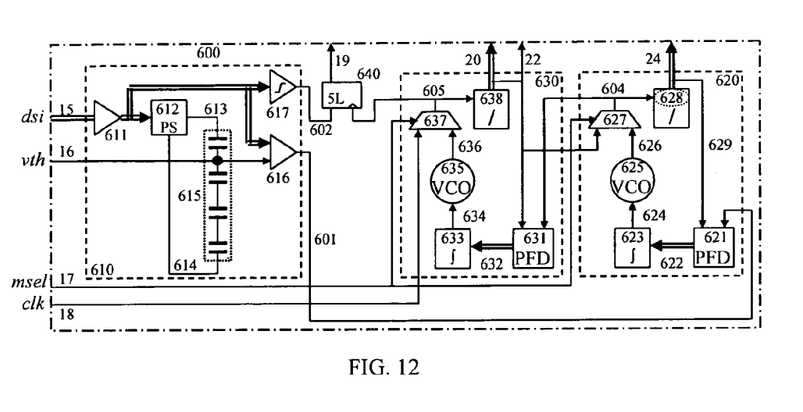
FIG. 12 is a block diagram of a differential deserializer timing circuit in accordance with an exemplary embodiment of the present invention.

A differential implementation of DES_TC 600 in accordance with the present invention is more straightforward. FIG. 12 is a block diagram of a differential deserializer timing circuit in accordance with an exemplary embodiment of the present invention. DES_TC 600 includes input detector 610 similar to ID 650 with a single-ended comparator 656 replaced by a differential comparator 616 capable of comparing both direct and inverted input signals to the same threshold voltage, and with comparator 657 replaced by limiting amplifier 617 not referencing a threshold voltage; double PLL similar to that of the SER_TC block; and the same 5L block 640 for data alignment. The operation of the block is illustrated by the timing diagram of FIG. 14.

Figure 13:
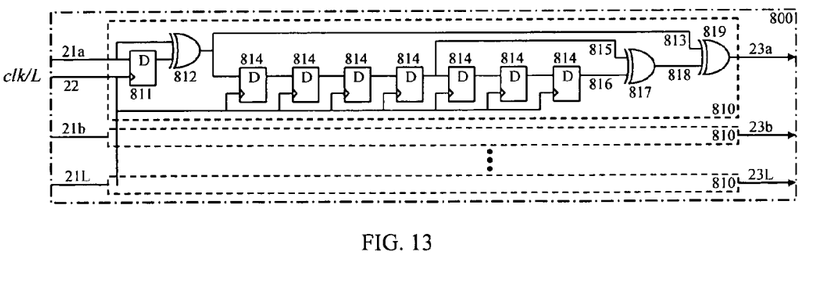
FIG. 13 is a block diagram of a differential deserializer digital data converter in accordance with an exemplary embodiment of the present invention.

A differential version of the DES_DDC block in accordance with the present invention performs an optional descrambling operation, which is a reverse function of the differential SER_DDC block 300 (of FIG. 3). One skilled in the art can easily understand the example of DES_DDC shown in FIG. 13, where flip-flop 811 and XOR gate 812 represent the decoder, while the shift register with flip-flops 814*a* to 814*g* and XOR gates 817 and 819 form a self-synchronizing descrambler.

Although this invention has been described in certain specific embodiments, many additional modifications and variations would be apparent to those skilled in the art. Specifically, serializers and deserializers for serial digital data communication have been disclosed but these aspects of the present invention are not limited to such applications. It is therefore to be understood that this invention may be practiced otherwise than as specifically described. Thus, the present embodiments of the invention should be considered in all respects as illustrative and not restrictive, the scope of the invention to be determined by any claims supported by this application and the claims' equivalents rather than the foregoing description.

What is claimed is:

1. A serializer for converting N-bit wide parallel input data words with rate B into a serial data bit stream with rate NB of out-going serial words, comprising:
    a first multiplexer with ratio N:L for conversion of the N-bit wide parallel input data words with rate B into L-bit wide data words with rate NB/L;
    a converter for generating encoded data words from the L-bit wide data words;
    a second multiplexer with ratio L:1 for conversion of the encoded data words with rate NB/L into a serial data bit stream with rate NB;
    a multilevel buffer for generating a multilevel output signal with marking pulses using the serial bit data stream and a synchronization signal; and
    a timing circuit for generating the synchronization signal, wherein the multilevel buffer further comprises:

a retiming sub-block for conversion of L-bit long synchronization pulses into 1-bit long retimed synchronization pulses; and a single-ended current-switching stage for generating a multilevel serial data signal in which an amplitude of a bit coincident with a synchronization pulse and having a preselected logic value is increased.

2. The serializer of claim 1, wherein the single-ended current-switching stage is for a preselected logic value of "1", the serializer further comprising:

a first current source for generation of a first current;

a second current source for generation of a second current with the same value as the first current;

a first single-pole/single-throw switch coupled to the first current source and being closed by a direct input data signal;

a second single-pole/single-throw switch coupled to the second current source and being closed by an inverted input data signal;

a third single-pole/single-throw switch coupled to the output of the first single-pole/single-throw switch and being closed by an inverted synchronization signal;

a first resistor coupling the output of the third single-pole/single-throw switch with a positive power supply node; and a second resistor coupling the output of the third single-pole/single-throw switch with the output of the second single-pole/single-throw switch serving as the stage output.

3. A serializer for converting N-bit wide parallel input data words with rate B into a serial data bit stream with rate NB of out-going serial words, comprising:

a first multiplexer with ratio N:L for conversion of the N-bit wide parallel input data words with rate B into L-bit wide data words with rate NB/L;

a converter for generating encoded data words from the L-bit wide data words;

a second multiplexer with ratio L:1 for conversion of the encoded data words with rate NB/L into a serial data bit stream with rate NB;

a multilevel buffer for generating a multilevel output signal with marking pulses using the serial bit data stream and a synchronization signal; and a timing circuit for generating the synchronization signal, wherein the multilevel buffer further comprises:

a retiming sub-block for generating 1-bit long retimed synchronization pulses using L-bit long synchronization pulses and for retiming and delay of the incoming serial data bit stream; and a differential current-switching stage for generating direct and inverted two logic level serial data signals wherein the amplitude of a bit coincident with the synchronization pulse and having a preselected logic value is increased to a third logic level.

4. The serializer of claim 3, wherein the differential current-switching stage for a preselected logic value of "1" further comprises:

a first current source for generation of a first current;

a second current source for generation of a second current with the same value as the first current;

a first single-pole/double-throw switch with its input coupled to the first current source and shorted to its first output by a direct input data signal;

a second single-pole/double-throw switch with its input coupled to the second current source and shorted to its first output by an inverted input data signal;

a first single-pole/single-throw switch coupled to the first output of the first single-pole/double-throw switch and being closed by an inverted synchronization signal;

a second single-pole/single-throw switch coupled to the second output of the first single-pole/double-throw switch and being closed by an inverted synchronization signal;

a first resistor coupling an output of the first single-pole/single-throw switch to a positive power supply node;

a second resistor coupling the output of the first single-pole/single-throw switch with the first output of the second single-pole/double-throw switch serving as the stage direct output;

a third resistor coupling the output of the second single-pole/single-throw switch with the same positive power supply node; and a fourth resistor connecting the output of the second single-pole/single-throw switch with the second output of the second single-pole/double-throw switch serving as the stage inverted output.

5. A deserializer circuit for generating N-bit wide parallel data words with rate B and a predetermined bit order from an incoming serial data bit stream with rate NB, comprising:

a timing circuit for generating timing signals using marking pulses imposed onto the incoming serial data stream, and for generating a serial data stream with rate NB;

a first demultiplexer with ratio 1:L for generating L-bit wide data words with rate NB/L using the serial data stream;

a data digital converter for generating decoded data words using the L-bit wide data words; and a second demultiplexer with ratio L:N for converting the decoded data words into N-bit wide parallel data words with rate B and a bit order predetermined by the alignment of the timing signals to the marking pulses, wherein the timing circuit further comprises:

a single-ended input detector for accepting the incoming serial data bit stream and retrieving data bits and synchronization pulses corresponding to the marking pulses, comprising:

a single-ended input buffer for impedance matching;

a single-ended pick sensor for detecting a maximum voltage level and a minimum voltage level of the input signal;

a voltage divider for generating a first threshold voltage and a second threshold voltage using the detected voltage levels;

a first comparator for retrieving synchronization pulse values in reference to the first threshold voltage; and a second comparator for retrieving data bit values in reference to the second threshold voltage.

6. A deserializer circuit for generating N-bit wide parallel data words with rate B and a predetermined bit order from an incoming serial data bit stream with rate NB, comprising:

a timing circuit for generating timing signals using marking pulses imposed onto the incoming serial data stream, and for generating a serial data stream with rate NB;

a first demultiplexer with ratio 1:L for generating L-bit wide data words with rate NB/L using the serial data stream;

a data digital converter for generating decoded data words using the L-bit wide data words; and a second demultiplexer with ratio L:N for converting the decoded data words into N-bit wide parallel data words with rate B and a bit order predetermined by the alignment of the timing signals to the marking pulses, wherein the timing circuit further comprises:
a single-ended input detector for accepting the incoming serial data bit stream and retrieving data bits and synchronization pulses corresponding to the marking pulses, comprising:
a single-ended input buffer for impedance matching;
a first comparator for retrieving synchronization pulse values in reference to a first external threshold voltage; and
a second comparator for retrieving data bit values in reference to a second external threshold voltage.

7. A deserializer circuit for generating N-bit wide parallel data words with rate B and a predetermined bit order from an incoming serial data bit stream with rate NB, comprising:
a timing circuit for generating timing signals using marking pulses imposed onto the incoming serial data stream, and for generating a serial data stream with rate NB;
a first demultiplexer with ratio 1:L for generating L-bit wide data words with rate NB/L using the serial data stream;
a data digital converter for generating decoded data words using the L-bit wide data words; and
a second demultiplexer with ratio L:N for converting the decoded data words into N-bit wide parallel data words with rate B and a bit order predetermined by the alignment of the timing signals to the marking pulses, wherein the timing circuit further comprises:
a differential input detector for accepting incoming direct and inverted serial data bit streams with imposed marking pulses and retrieving data bits and synchronization pulses corresponding to the marking pulses, comprising:
a differential input buffer for impedance matching;
a differential pick sensor for detecting a maximum voltage level and a minimum voltage level of the input signal;
a voltage divider for generating a first threshold voltage using the detected voltage levels;
a differential comparator for retrieving synchronization pulse values from both direct and inverted input bit streams in reference to the first threshold voltage; and
a limiting amplifier with two standard output voltage levels for reconstruction of data bit values.

8. A deserializer circuit for generating N-bit wide parallel data words with rate B and a predetermined bit order from an incoming serial data bit stream with rate NB, comprising:
a timing circuit for generating timing signals using marking pulses imposed onto the incoming serial data stream, and for generating a serial data stream with rate NB;
a first demultiplexer with ratio 1:L for generating L-bit wide data words with rate NB/L using the serial data stream;
a data digital converter for generating decoded data words using the L-bit wide data words; and
a second demultiplexer with ratio L:N for converting the decoded data words into N-bit wide parallel data words with rate B and a bit order predetermined by the alignment of the timing signals to the marking pulses, wherein the timing circuit further comprises:
a differential input detector for accepting incoming direct and inverted serial data bit streams with imposed marking pulses and retrieving data bits and synchronization pulses corresponding to the marking pulses, comprising:
a differential input buffer for impedance matching;
a differential comparator for retrieving synchronization pulse values from both direct and inverted input bit streams in reference to an external threshold voltage; and
a limiting amplifier with two standard output voltage levels for reconstruction of data bit values.

* * * * *